(12) United States Patent
Zhu (10) Patent No.: US 11,361,725 B2
(45) Date of Patent: Jun. 14, 2022

(54) GOA CIRCUIT AND DISPLAY PANEL

(71) Applicant: TCL CHINA STAR OPTOELECTRONICS TECHNOLOGY CO., LTD., Guangdong (CN)

(72) Inventor: Jing Zhu, Guangdong (CN)

(73) Assignee: TCL CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 213 days.

(21) Appl. No.: 16/757,504

(22) PCT Filed: Mar. 13, 2020

(86) PCT No.: PCT/CN2020/079145
§ 371 (c)(1),
(2) Date: Apr. 20, 2020

(87) PCT Pub. No.: WO2021/164076
PCT Pub. Date: Aug. 26, 2021

(65) Prior Publication Data
US 2021/0407452 A1 Dec. 30, 2021

(30) Foreign Application Priority Data
Feb. 21, 2020 (CN) .......................... 202010106545.6

(51) Int. Cl.
*G09G 3/36* (2006.01)

(52) U.S. Cl.
CPC ..... *G09G 3/3677* (2013.01); *G09G 2300/0447* (2013.01); *G09G 2310/0286* (2013.01); *G09G 2310/08* (2013.01)

(58) Field of Classification Search
CPC ............ G09G 3/3677; G09G 2310/08; G09G 2300/0447; G09G 2310/0286; G11C 19/28
See application file for complete search history.

(56) References Cited

U.S. PATENT DOCUMENTS

2020/0365107 A1* 11/2020 Li .................. G09G 3/3677

FOREIGN PATENT DOCUMENTS

WO WO-2020199486 A1 * 10/2020 ........... G09G 3/3674

* cited by examiner

*Primary Examiner* — Jonathan A Boyd
(74) *Attorney, Agent, or Firm* — Dickinson Wright PLLC (57) ABSTRACT

A GOA circuit is provided and includes a plurality of GOA sub circuits which are cascaded. An Nth GOA sub circuit of the GOA sub circuits includes: a cascade control unit configured to generate a first drive signal according to an (N−3)th scan signal and an (N−3)th cascade signal; a cascade signal generation unit connected to the cascade control unit; a first scan drive unit connected to the cascade control unit and a first low voltage level signal; and a second scan drive unit connected to the cascade control unit and the first low voltage level signal.

19 Claims, 9 Drawing Sheets

GOA CIRCUIT AND DISPLAY PANEL

TECHNICAL FIELD

The present disclosure relates to the display technology field, especially for the vertical alignment display technology field, and more particularly to a GOA circuit and a display panel.

BACKGROUND

With the continuous development of display technology, liquid crystal display panels seek goals of large screen, high resolution, and high refresh frequency. When a user views a vertical aligned liquid crystal display panel from the side, color difference phenomenon or color washout phenomenon occurs, especially for the liquid crystal display panel having a large size. The color washout increases with the increasing of a side viewing angle. The color washout can be reduced by increasing a range of a viewable angle. Usually, each pixel point in a display area of the liquid crystal display panel is divided into a main pixel and a sub pixel.

Figure 1:
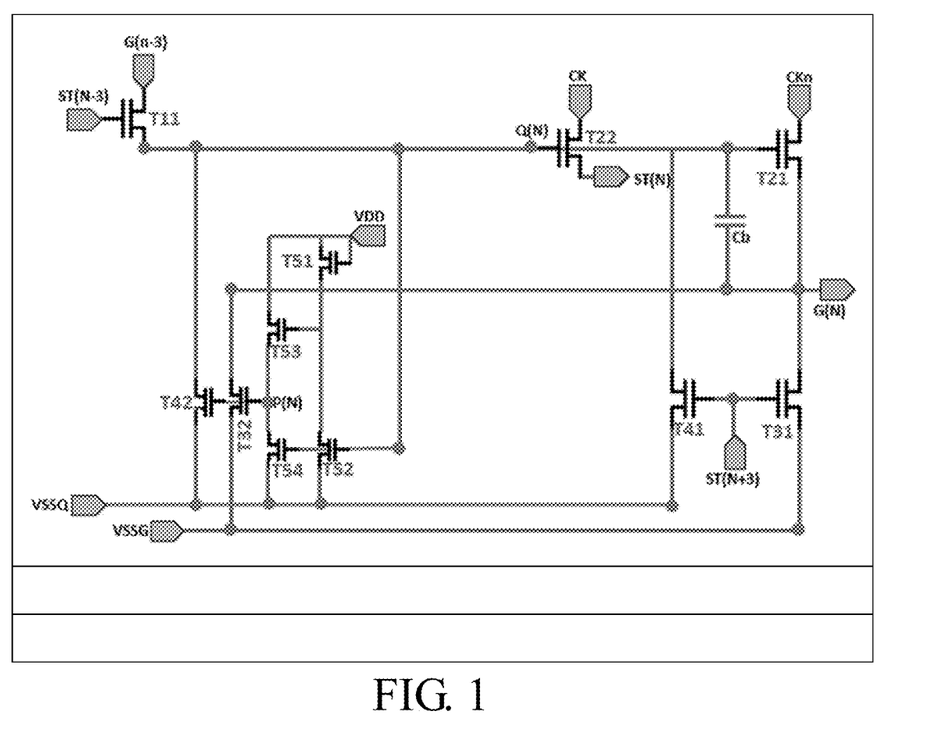
FIG. 1 illustrates a structural diagram of a gate drive circuit utilized for a main pixel or a sub pixel in a 2G1D mode in a conventional technical scheme.
Figure 2:
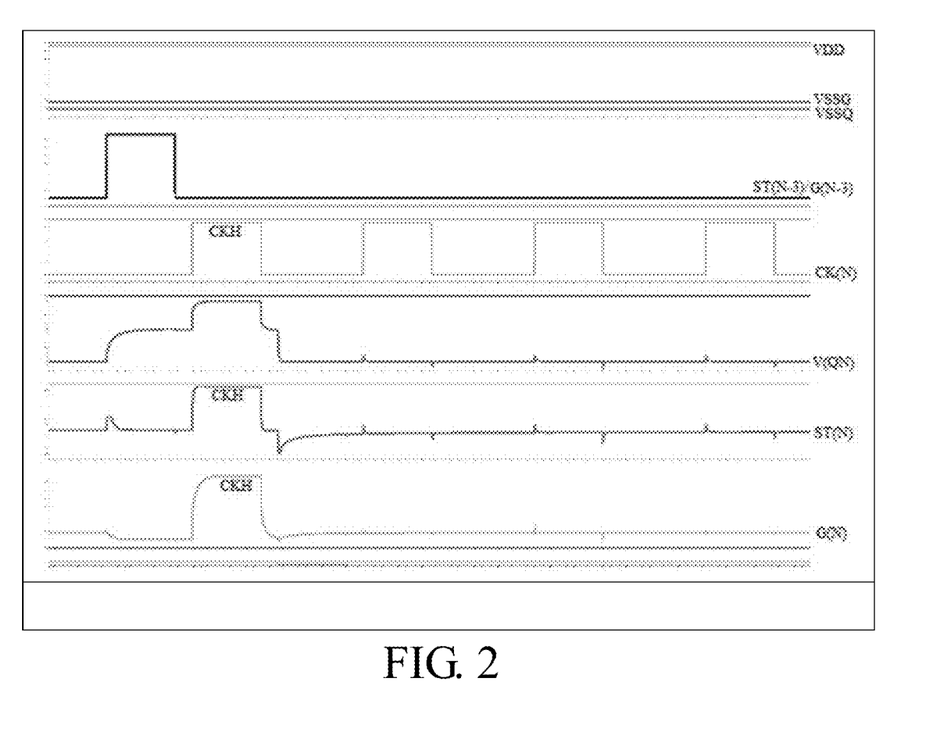
FIG. 2 illustrates waveform diagrams of corresponding nodes in the gate drive circuit in FIG. 1.

However, in a conventional pixel design of eight-domain display, a 2G1D (referring to two gate drive circuits and one data line) mode is most used to implement gate drive voltages of the main pixel and the sub pixel. Two same or similar gate drive circuits are required for the main pixel and the sub pixel in the same pixel point. The gate drive circuits are shown in FIG. 1. A timing diagram of each outputted signal is shown in FIG. 2. This increases a number of chip on films (COF) in a gate driver on array (GOA) circuit and a number of fanouts. This also increases a manufacturing cost and a width of a border. Brightness of the main pixel and brightness of the sub pixel may be independently controlled by different gate drive voltages, thereby implementing to improve the problem of the color difference or color washout.

SUMMARY OF DISCLOSURE

The present disclosure provides a GOA circuit to solve the technical problem that a number of chip on films (COF) and a number of fanouts in the GOA circuit are increased when the 2G1D mode is adopted in the eight-domain display.

In a first aspect, the present disclosure provides a GOA circuit including a plurality of GOA sub circuits which are cascaded. An Nth GOA sub circuit of the GOA sub circuits includes: a cascade control unit, a cascade signal generation unit, a first scan drive unit, and a second scan drive unit. The cascade control unit is configured to generate a first drive signal according to an (N−3)th scan signal and an (N−3)th cascade signal. The cascade signal generation unit is connected to the cascade control unit and configured to generate an Nth cascade signal according to the first drive signal and an Nth clock signal. The first scan drive unit is connected to the cascade control unit and a first low voltage level signal and configured to generate, according to the Nth clock signal, an (N+3)th cascade signal, and the first drive signal, an Nth main pixel scan signal to drive a main pixel of an Nth pixel point. The second scan drive unit is connected to the cascade control unit and the first low voltage level signal and configured to generate, according to a high voltage level signal, the (N+3)th cascade signal, and the first drive signal, an Nth sub pixel scan signal to drive a sub pixel of the Nth pixel point. N is a positive integer.

In a first implementation of the first aspect in combination with the first aspect, the Nth GOA sub circuit further includes: a first pull-down unit connected to the cascade control unit and a second low voltage level signal and configured to control, according to the (N+3)th cascade signal, whether the first drive signal is in a low voltage level state.

In a second implementation of the first aspect in combination with of the first implementation of the first aspect, the Nth GOA sub circuit further includes: a drive signal generation unit connected to the cascade control unit and the second low voltage level signal and configured to generate a second drive signal according to the first drive signal; and a second pull-down unit connected to the cascade control unit, the second low voltage level signal, and the drive signal generation unit and configured to control, according to the second drive signal, whether the first drive signal is in the low voltage level state; wherein when the first drive signal is in a high voltage level state, the second drive signal is in the low voltage level state; when the first drive signal is in the low voltage level state, the second drive signal is in the high voltage level state.

In a third implementation of the first aspect in combination with of the second implementation of the first aspect, the Nth GOA sub circuit further includes: a third pull-down unit connected to the cascade control unit, the first low voltage level signal, and the drive signal generation unit and configured to control, according to the second drive signal, whether the Nth main pixel scan signal is in the low voltage level state.

In a fourth implementation of the first aspect in combination with of the second implementation of the first aspect, the Nth GOA sub circuit further includes: a fourth pull-down unit connected to the cascade control unit, the first low voltage level signal, and the drive signal generation unit and configured to control, according to the second drive signal, whether the Nth sub pixel scan signal is in the low voltage level state.

In a fifth implementation of the first aspect in combination with of the first aspect, the cascade control unit includes a first thin film transistor; a gate of the first thin film transistor is inputted with the (N+3)th cascade signal, a drain of the first thin film transistor is inputted with the (N−3)th scan signal, and a source of the first thin film transistor is configured to output the first drive signal.

In a sixth implementation of the first aspect in combination with of the fifth implementation of the first aspect, the cascade signal generation unit includes a second thin film transistor; a drain of the second thin film transistor is inputted with the Nth clock signal, a gate of the second thin film transistor is connected to the source of the first thin film transistor, so that the gate of the second thin film transistor is inputted with the first drive signal; a source of the second thin film transistor is configured to output the Nth cascade signal.

In a seventh implementation of the first aspect in combination with of the fifth implementation of the first aspect, the first scan drive unit includes a capacitor, a third thin film transistor, and a fourth transistor; a drain of the third thin film transistor is inputted with the Nth clock signal, and the source of the first thin film transistor is connected to a gate of the third thin film transistor and a first terminal of the capacitor, a gate of the fourth transistor is connected to the first low voltage level signal, and a source of the third thin film transistor is connected to a drain of the fourth transistor and a second terminal of the capacitor.

In an eighth implementation of the first aspect in combination with of the fifth implementation of the first aspect, the second scan drive unit includes a fifth thin film transistor and a sixth transistor; a drain of the fifth thin film transistor is inputted with the Nth clock signal, a gate of the fifth thin film transistor is connected to the source of the first thin film transistor, and a source of the fifth thin film transistor is connected to a drain of the sixth thin film transistor; a gate of the sixth thin film transistor is inputted with the (N+3)th cascade signal, and a source of the sixth thin film transistor is inputted with the first low voltage level signal.

In a second aspect, the present disclosure further provides a display panel including the GOA circuit in any one of the above-mentioned implementations.

Advantageous effect of the present disclosure is described as follows. In the GOA circuit provided by the present disclosure, the cascade control unit outputs the first drive signal. The first drive signal controls the first scan drive unit and the second scan drive unit to simultaneously output the Nth main pixel scan signal and the Nth sub pixel scan signal which have different voltage waveforms, thereby improving the color difference phenomenon or the color washout phenomenon. The present disclosure further simplifies the circuit structure of GOA circuit, and a number of chip on films (COF) in the GOA circuit and a number of fanouts can be decreased.

DETAILED DESCRIPTION OF EMBODIMENTS

To make the objectives, technical schemes, and technical effects of the present disclosure more clearly and definitely, the present disclosure will be described in details below by using embodiments in conjunction with the appending drawings. It should be understood that the specific embodiments described herein are merely for explaining the present disclosure but are not intended to limit the present disclosure.

Figure 3:
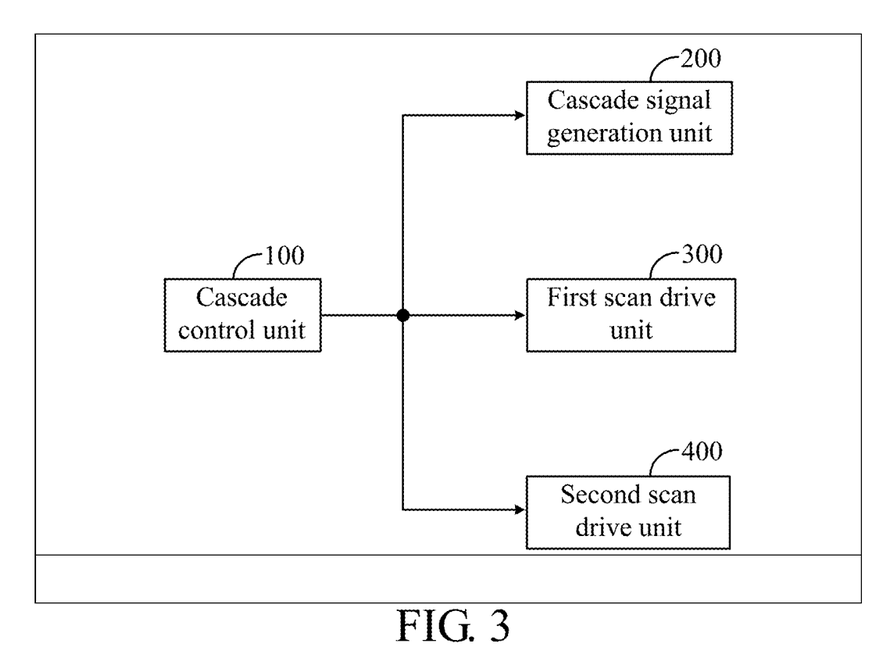
FIG. 3 illustrates a first structure of a GOA circuit in accordance with an embodiment of the present disclosure.

As shown in FIG. 3, the present embodiment provides a GOA circuit. The GOA circuit includes a plurality of GOA sub circuits which are cascaded. An Nth GOA sub circuit of the GOA sub circuits includes a cascade control unit 100, a cascade signal generation unit 200, a first scan drive unit 300, and a second scan drive unit 400. The cascade control unit 100 is configured to generate a first drive signal Q(N) according to an (N−3)th scan signal G(N−3) and an (N−3)th cascade signal ST(N−3). The cascade signal generation unit 200 is connected to the cascade control unit 100 and configured to generate an Nth cascade signal ST(N) according to the first drive signal Q(N) and an Nth clock signal CK(N). The first scan drive unit 300 is connected to the cascade control unit 100 and a first low voltage level signal VSSG and configured to generate, according to the Nth clock signal CK(N), an (N+3)th cascade signal ST(N+3), and the first drive signal Q(N), an Nth main pixel scan signal GA(N) to drive a main pixel of an Nth pixel point. The second scan drive unit 400 is connected to the cascade control unit 100 and the first low voltage level signal VSSG and configured to generate, according to a high voltage level signal VDD, the (N+3)th cascade signal ST(N+3), and the first drive signal Q(N), an Nth sub pixel scan signal GB(N) to drive a sub pixel of the Nth pixel point. N is a positive integer.

In detail, when N is a positive integer smaller than 4, the (N−3)th scan signal G(N−3) and the (N−3)th cascade signal ST(N−3) are included in an initialization signal. The cascade control unit 100 is configured to generate the first drive signal Q(N) according to the initialization signal. When N is a positive integer equal to or greater than 4, the cascade control unit 100 is configured to generate the first drive signal Q(N) according to the (N−3)th scan signal G(N−3) and the (N−3)th cascade signal ST(N−3).

When the (N−3)th scan signal G(N−3) and the (N−3)th cascade signal ST(N−3) are in a high voltage level state, the first drive signal Q(N) is in the high voltage level state. In the meantime, the first drive signal Q(N) controls the cascade signal generation unit 200 to output the Nth cascade signal ST(N) according to the Nth clock signal CK(N). In the meantime, the first drive signal Q(N) controls the first scan drive unit 300 to output the Nth main pixel scan signal GA(N) according to the Nth clock signal CK(N) and controls the second scan drive unit 400 to output the Nth sub pixel scan signal GB(N) according to the high voltage level signal VDD. When the (N+3)th cascade signal ST(N+3) are in the high voltage level state, the (N+3)th cascade signal ST(N+3) controls the first scan drive unit 300 and the second scan drive unit 400 to pull down the Nth main pixel scan signal GA(N) and the Nth sub pixel scan signal GB(N) to be in a low voltage level state the same as the first low voltage level signal VSSG In the GOA sub circuit of the present embodiment, the cascade control unit 100 outputs the first drive signal Q(N). The first drive signal Q(N) controls the first scan drive unit 300 and the second scan drive unit 400 to simultaneously output the Nth main pixel scan signal and the Nth sub pixel scan signal which have different voltage waveforms, thereby improving the color difference phenomenon or the color washout phenomenon. Furthermore, the cascade signal generation unit 200 generates the Nth cascade signal ST(N) according to the first drive signal Q(N) and the Nth clock signal CK(N). This provides a condition to cascade the GOA sub circuits. When compared with the 2G1D mode in FIG. 1, the GOA circuit provided by the present embodiment of the present disclosure simplifies the circuit structure of the 2G1D mode. As a result, a number of chip on films (COF) in the GOA circuit and a number of fanouts can be decreased, and it is beneficial to implement to reduce a manufacturing cost and a width of a border.

Figure 4:
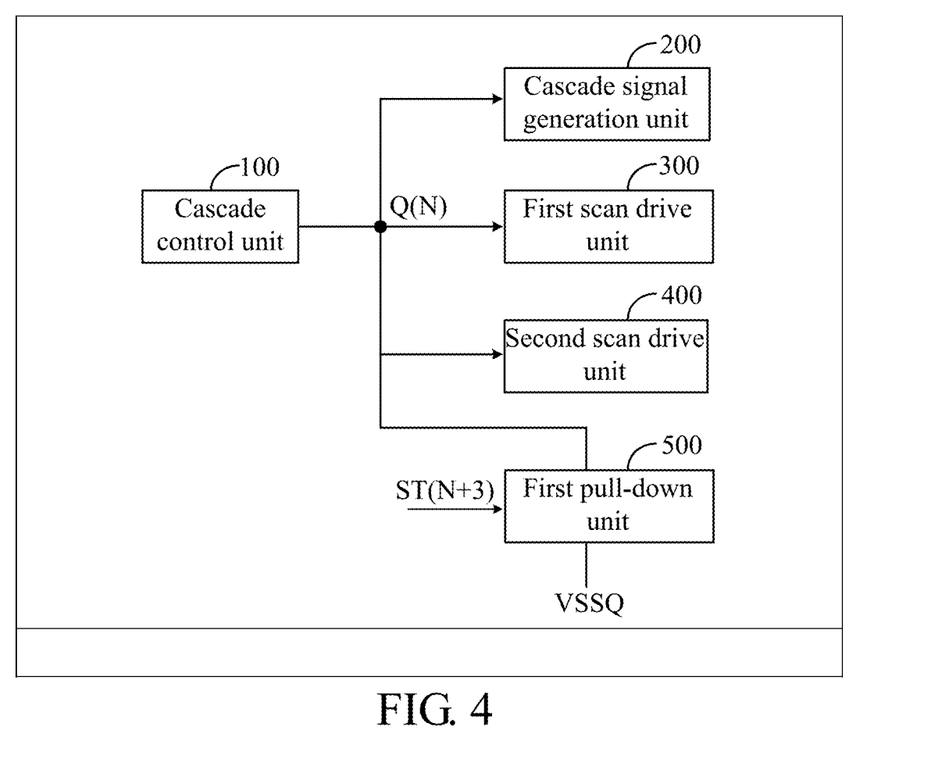
FIG. 4 illustrates a second structure of a GOA circuit in accordance with an embodiment of the present disclosure.

As shown in FIG. 4, in one embodiment, the Nth GOA sub circuit further includes a first pull-down unit 500 connected to the cascade control unit 100 and a second low voltage level signal VSSQ and configured to control, according to the (N+3)th cascade signal ST(N+3), whether the first drive signal Q(N) is in the low voltage level state.

In detail, when the (N+3)th cascade signal ST(N+3) is in the high voltage level state, the (N+3)th cascade signal ST(N+3) controls the first pull-down unit 500 to pull down the first drive signal Q(N) to be in the low voltage level state the same as the second low voltage level signal VSSQ, so that the first drive signal Q(N) is clamped in the low voltage level state the same as the second low voltage level signal VSSQ.

Figure 5:
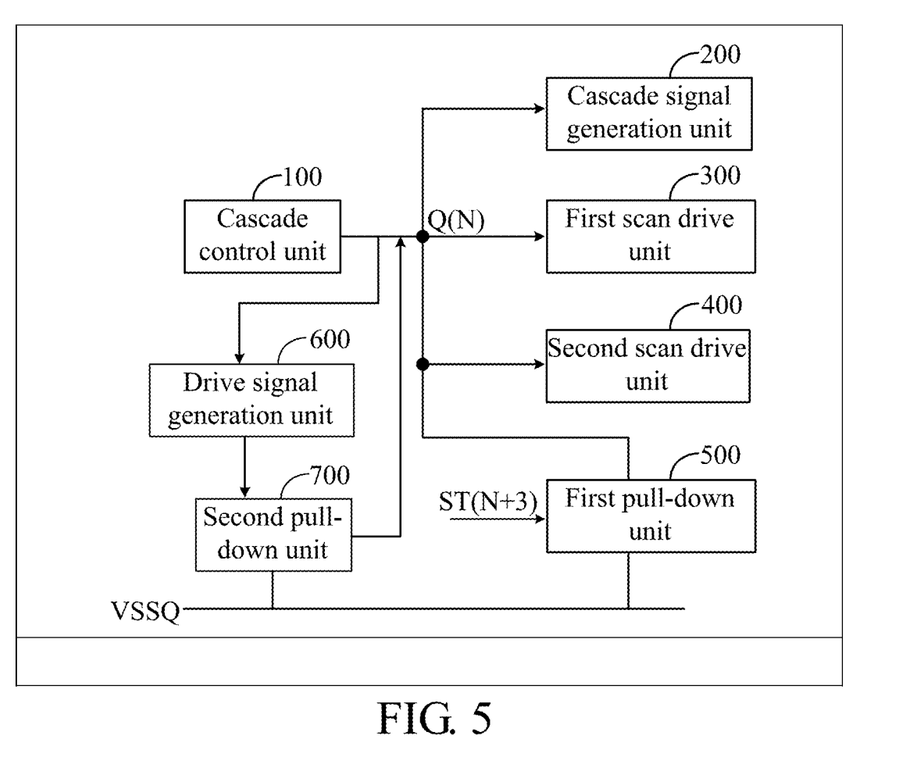
FIG. 5 illustrates a third structure of a GOA circuit in accordance with an embodiment of the present disclosure.

As shown in FIG. 5, in another embodiment, the Nth GOA sub circuit further includes: a drive signal generation unit 600 connected to the cascade control unit 100 and the second low voltage level signal VSSQ and configured to generate a second drive signal P(N) according to the first drive signal Q(N); and a second pull-down unit 700 connected to the cascade control unit 100, the second low voltage level signal VSSQ, and the drive signal generation unit 600 and configured to control, according to the second drive signal P(N), whether the first drive signal Q(N) is in the low voltage level state. When the first drive signal Q(N) is in the high voltage level state, the second drive signal P(N) is in the low voltage level state. When the first drive signal Q(N) is in the low voltage level state, the second drive signal P(N) is in the high voltage level state.

In detail, when the first drive signal Q(N) is in the low voltage level state, the second drive signal P(N) is in the high voltage level state. The second drive signal P(N) controls the second pull-down unit 700 to pull down the first drive signal Q(N) to be in the low voltage level state the same as the second low voltage level signal VSSQ, so that the first drive signal Q(N) is clamped in the low voltage level state.

Figure 6:
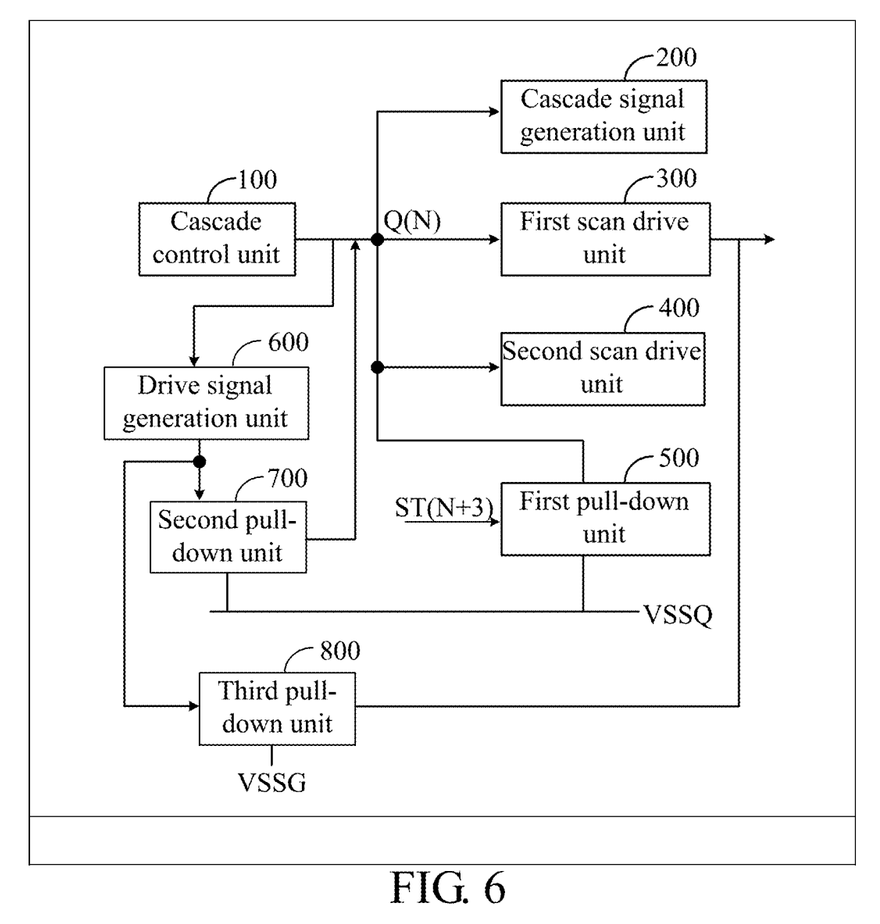
FIG. 6 illustrates a fourth structure of a GOA circuit in accordance with an embodiment of the present disclosure.

As shown in FIG. 6, in yet another embodiment, the Nth GOA sub circuit further includes a third pull-down unit 800 connected to the cascade control unit 100, the first low voltage level signal VSSG, and the drive signal generation unit 600 and configured to control, according to the second drive signal P(N), whether the Nth main pixel scan signal GA(N) is in the low voltage level state.

In detail, when the first drive signal Q(N) is in the low voltage level state, the second drive signal P(N) is in the high voltage level state. The second drive signal P(N) controls the third pull-down unit 800 to pull down the Nth main pixel scan signal GA(N) to be in the low voltage level state the same as the first low voltage level signal VSSG, so that the Nth main pixel scan signal GA(N) is clamped in the low voltage level state.

Figure 7:
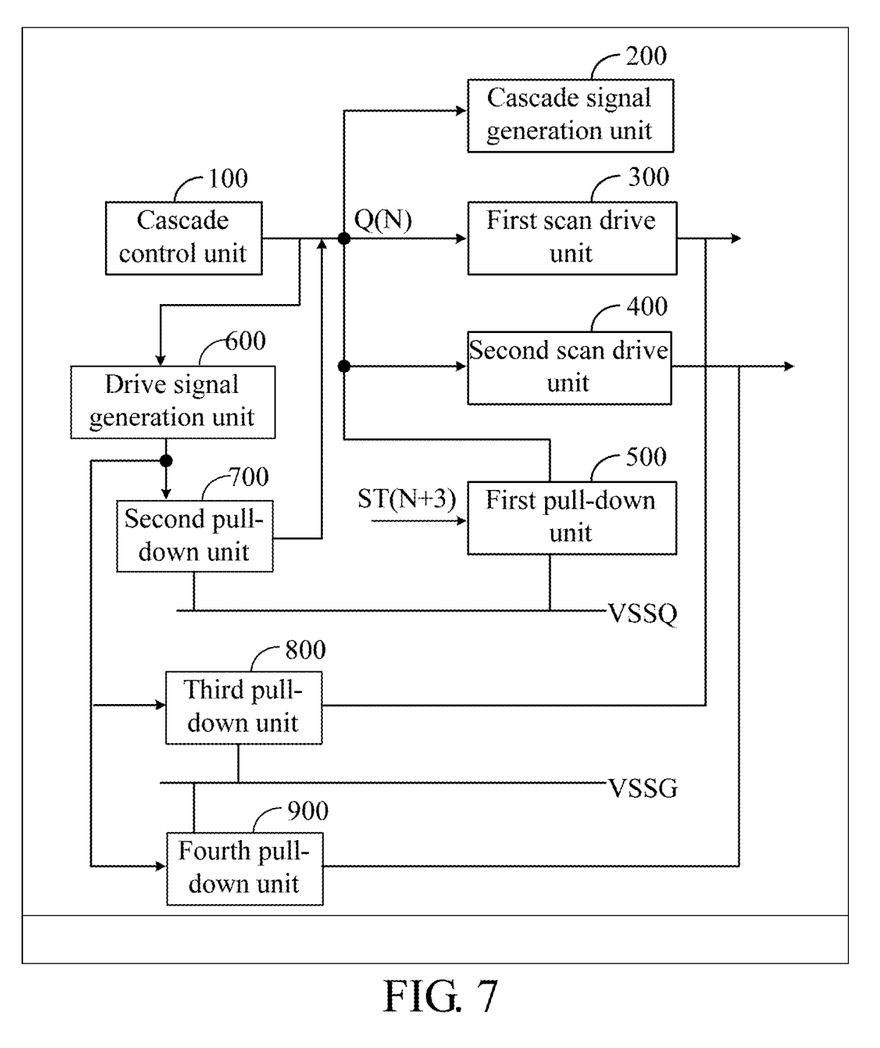
FIG. 7 illustrates a second structure of a GOA circuit in accordance with an embodiment of the present disclosure.

As shown in FIG. 7, in yet another embodiment, the Nth GOA sub circuit further includes a fourth pull-down unit 900 connected to the cascade control unit 100, the first low voltage level signal VSSG, and the drive signal generation unit 600 and configured to control, according to the second drive signal P(N), whether the Nth sub pixel scan signal GB(N) is in the low voltage level state.

In detail, when the first drive signal Q(N) is in the low voltage level state, the second drive signal P(N) is in the high voltage level state. The second drive signal P(N) controls the fourth pull-down unit 900 to pull down the Nth sub pixel scan signal GB(N) to be in the low voltage level state the same as the first low voltage level signal VSSG, so that the Nth sub pixel scan signal GB(N) is clamped in the low voltage level state.

Figure 8:
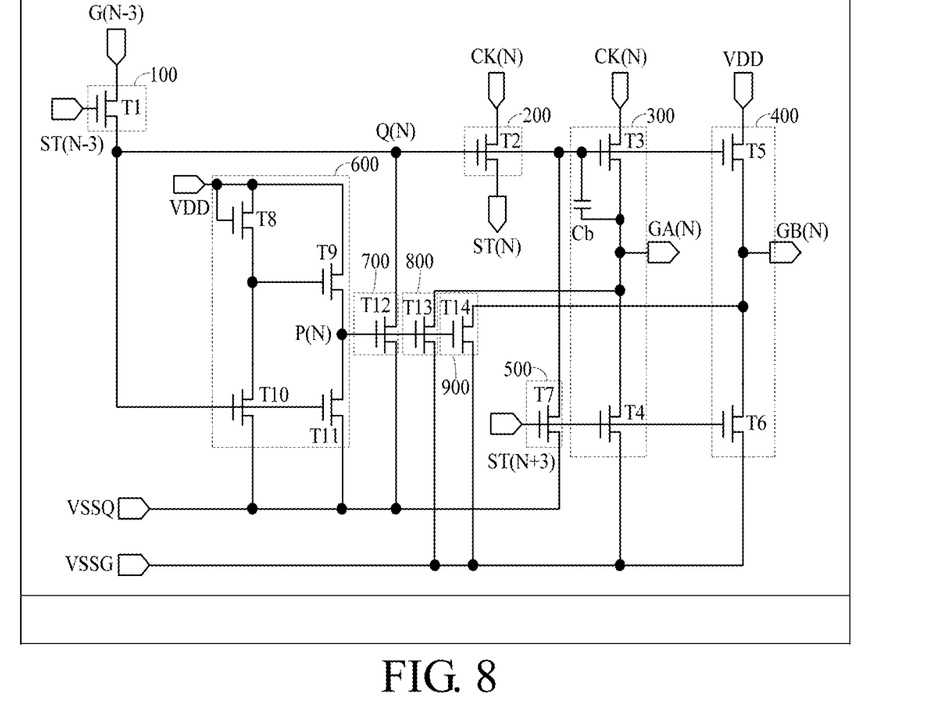
FIG. 8 illustrates a fifth structure of a GOA circuit in accordance with an embodiment of the present disclosure.

As shown in FIG. 8, in yet another embodiment, the cascade control unit 100 includes a first thin film transistor T1. A gate of the first thin film transistor T1 is inputted with the (N+3)th cascade signal ST(N+3). A drain of the first thin film transistor T1 is inputted with the (N−3)th scan signal G(N−3). A source of the first thin film transistor T1 is configured to output the first drive signal Q(N).

As shown in FIG. 8, in yet another embodiment, the cascade signal generation unit 200 includes a second thin film transistor T2. A drain of the second thin film transistor T2 is inputted with the Nth clock signal CK(N). A gate of the second thin film transistor T2 is connected to the source of the first thin film transistor T1, so that the gate of the second thin film transistor T2 is inputted with the first drive signal Q(N). A source of the second thin film transistor T2 is configured to output the Nth cascade signal ST(N).

As shown in FIG. 8, in yet another embodiment, the first scan drive unit 300 includes a capacitor Cb, a third thin film transistor T3, and a fourth transistor T4. A drain of the third thin film transistor T3 is inputted with the Nth clock signal CK(N). The source of the first thin film transistor T1 is connected to a gate of the third thin film transistor T3 and a first terminal of the capacitor Cb. A gate of the fourth transistor T4 is connected to the first low voltage level signal VSSG A source of the third thin film transistor T3 is connected to a drain of the fourth transistor T4 and a second terminal of the capacitor Cb.

As shown in FIG. 8, in yet another embodiment, the second scan drive unit 400 includes a fifth thin film transistor T5 and a sixth transistor T6. A drain of the fifth thin film transistor T5 is inputted with the Nth clock signal CK(N). A gate of the fifth thin film transistor T5 is connected to the source of the first thin film transistor T1. A source of the fifth thin film transistor T5 is connected to a drain of the sixth thin film transistor T6. A gate of the sixth thin film transistor T6 is inputted with the (N+3)th cascade signal ST(N+3). A source of the sixth thin film transistor T6 is inputted with the first low voltage level signal VSSG As shown in FIG. 8, in yet another embodiment, the first pull-down unit 500 includes a seventh thin film transistor T7. A gate of the seventh thin film transistor T7 is inputted with the (N+3)th cascade signal ST(N+3). A drain of the seventh thin film transistor T7 is connected to the source of the first thin film transistor T1. A source of the seventh thin film transistor T7 is connected to the second low voltage level signal VSSQ.

As shown in FIG. 8, in yet another embodiment, the drive signal generation unit 600 includes an eighth thin film transistor T8, a ninth thin film transistor T9, a tenth thin film transistor T10, and eleventh thin film transistor T11. The high voltage level signal VDD is connected to a gate of the eighth thin film transistor T8, a drain of the eighth thin film transistor T8, and a drain of the ninth thin film transistor T9. A source of the eighth thin film transistor T8 is connected to a gate of the ninth thin film transistor T9 and a drain of the tenth thin film transistor T10. A source of the ninth thin film transistor T9 is connected to a drain of the eleventh thin film transistor T11. The source of the first thin film transistor T1 is connected to a gate of the tenth thin film transistor T10 and a gate of the eleventh thin film transistor T11. The second low voltage level signal VSSQ is connected to a source of the tenth thin film transistor T10 and a source of the eleventh thin film transistor T11.

As shown in FIG. 8, in yet another embodiment, the second pull-down unit 700 includes a twelfth thin film transistor T12. A drain of the twelfth thin film transistor T12 is connected to the source of the first thin film transistor T1. A source of the twelfth thin film transistor T12 is connected to the second low voltage level signal VSSQ. A gate of the twelfth thin film transistor T12 is connected to the drain of the eleventh thin film transistor T11.

As shown in FIG. 8, in yet another embodiment, the third pull-down unit 800 includes a thirteenth thin film transistor T13. A drain of the thirteenth thin film transistor T13 is connected to the drain of the fourth thin film transistor T4. A source of the thirteenth thin film transistor T13 is connected to the first low voltage level signal VSSG A gate of the thirteenth thin film transistor T13 is connected to the drain of the eleventh thin film transistor T11.

As shown in FIG. 8, in yet another embodiment, the fourth pull-down unit 900 includes a fourteenth thin film transistor T14. A drain of the fourteenth thin film transistor T14 is connected to the drain of the sixth thin film transistor T6. A source of the fourteenth thin film transistor T14 is connected to the first low voltage level signal VSSG A gate of the fourteenth thin film transistor T14 is connected to the drain of the eleventh thin film transistor T11.

Figure 9:
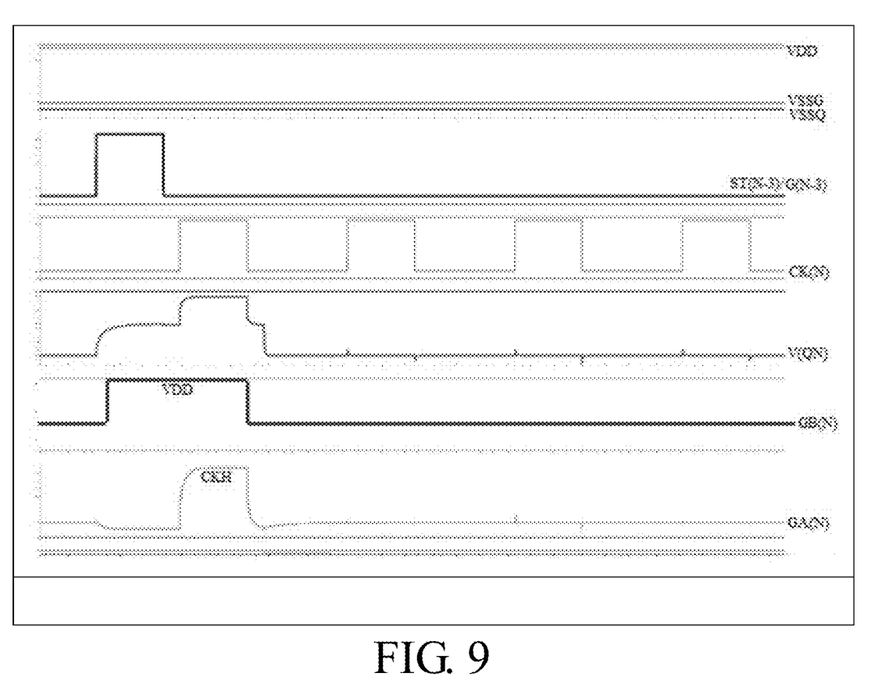
FIG. 9 illustrates waveform diagrams of corresponding nodes in the GOA circuit in FIG. 8.

A shown in FIG. 9, when the main pixel and the sub pixel of one pixel point are charged simultaneously, the drive voltage waveforms of the main pixel and sub pixel are different, thereby implementing charging differences of the main pixel and the sub pixel to solve the problem of the color difference or color washout when viewing from the side.

Yet another embodiment further provides a display panel including the GOA circuit of any one of the above-mentioned embodiments.

In summary, although the present disclosure has been provided in the preferred embodiments described above, the foregoing preferred embodiments are not intended to limit the present disclosure. Those skilled in the art, without departing from the spirit and scope of the present disclosure, may make modifications and variations, so the scope of the protection of the present disclosure is defined by the claims.

What is claimed is:

1. A GOA circuit, comprising a plurality of GOA sub circuits which are cascaded, wherein an Nth GOA sub circuit of the GOA sub circuits comprises:
   a cascade control unit configured to generate a first drive signal according to an (N−3)th scan signal and an (N−3)th cascade signal;
   a cascade signal generation unit connected to the cascade control unit and configured to generate an Nth cascade signal according to the first drive signal and an Nth clock signal;
   a first scan drive unit connected to the cascade control unit and a first low voltage level signal and configured to generate, according to the Nth clock signal, an (N+3)th cascade signal, and the first drive signal, an Nth main pixel scan signal to drive a main pixel of an Nth pixel point; and
   a second scan drive unit connected to the cascade control unit and the first low voltage level signal and configured to generate, according to a high voltage level signal, the (N+3)th cascade signal, and the first drive signal, an Nth sub pixel scan signal to drive a sub pixel of the Nth pixel point;
   wherein the Nth GOA sub circuit further comprises a fourth pull-down unit, and the fourth pull-down unit comprises a fourteenth thin film transistor;
   a drain of the fourteenth thin film transistor is connected to a drain of a sixth thin film transistor, a source of the fourteenth thin film transistor is connected to the first low voltage level signal, and a gate of the fourteenth thin film transistor is connected to a drain of an eleventh thin film transistor;
   wherein N is a positive integer; and
   wherein the first drive signal controls the first scan drive unit and the second scan drive unit to simultaneously output the Nth main pixel scan signal and the Nth sub pixel scan signal which have different voltage waveforms.

2. The GOA circuit of claim 1, wherein the Nth GOA sub circuit further comprises:
   a first pull-down unit connected to the cascade control unit and a second low voltage level signal and configured to control, according to the (N+3)th cascade signal, whether the first drive signal is in a low voltage level state.

3. The GOA circuit of claim 2, wherein the Nth GOA sub circuit further comprises:
   a drive signal generation unit connected to the cascade control unit and the second low voltage level signal and configured to generate a second drive signal according to the first drive signal; and
   a second pull-down unit connected to the cascade control unit, the second low voltage level signal, and the drive signal generation unit and configured to control, according to the second drive signal, whether the first drive signal is in the low voltage level state;
   wherein when the first drive signal is in a high voltage level state, the second drive signal is in the low voltage level state;
   when the first drive signal is in the low voltage level state, the second drive signal is in the high voltage level state.

4. The GOA circuit of claim 3, wherein the Nth GOA sub circuit further comprises:
   a third pull-down unit connected to the cascade control unit, the first low voltage level signal, and the drive signal generation unit and configured to control, according to the second drive signal, whether the Nth main pixel scan signal is in the low voltage level state.

5. The GOA circuit of claim 4, wherein the cascade control unit comprises a first thin film transistor;
   a gate of the first thin film transistor is inputted with the (N+3)th cascade signal, a drain of the first thin film transistor is inputted with the (N−3)th scan signal, and a source of the first thin film transistor is configured to output the first drive signal.

6. A GOA circuit, comprising a plurality of GOA sub circuits which are cascaded, wherein an Nth GOA sub circuit of the GOA sub circuits comprises:
   a cascade control unit configured to generate a first drive signal according to an (N−3)th scan signal and an (N−3)th cascade signal;
   a cascade signal generation unit connected to the cascade control unit and configured to generate an Nth cascade signal according to the first drive signal and an Nth clock signal;
   a first scan drive unit connected to the cascade control unit and a first low voltage level signal and configured to generate, according to the Nth clock signal, an (N+3)th cascade signal, and the first drive signal, an Nth main pixel scan signal to drive a main pixel of an Nth pixel point; and
   a second scan drive unit connected to the cascade control unit and the first low voltage level signal and configured to generate, according to a high voltage level signal, the (N+3)th cascade signal, and the first drive signal, an Nth sub pixel scan signal to drive a sub pixel of the Nth pixel point;
   wherein N is a positive integer; and
   wherein the first drive signal controls the first scan drive unit and the second scan drive unit to simultaneously output the Nth main pixel scan signal and the Nth sub pixel scan signal which have different voltage waveforms.

7. The GOA circuit of claim 6, wherein the Nth GOA sub circuit further comprises:
   a first pull-down unit connected to the cascade control unit and a second low voltage level signal and configured to control, according to the (N+3)th cascade signal, whether the first drive signal is in a low voltage level state.

8. The GOA circuit of claim 7, wherein the Nth GOA sub circuit further comprises:
a drive signal generation unit connected to the cascade control unit and the second low voltage level signal and configured to generate a second drive signal according to the first drive signal; and
a second pull-down unit connected to the cascade control unit, the second low voltage level signal, and the drive signal generation unit and configured to control, according to the second drive signal, whether the first drive signal is in the low voltage level state;
wherein when the first drive signal is in a high voltage level state, the second drive signal is in the low voltage level state;
when the first drive signal is in the low voltage level state, the second drive signal is in the high voltage level state.

9. The GOA circuit of claim 8, wherein the Nth GOA sub circuit further comprises:
a third pull-down unit connected to the cascade control unit, the first low voltage level signal, and the drive signal generation unit and configured to control, according to the second drive signal, whether the Nth main pixel scan signal is in the low voltage level state.

10. The GOA circuit of claim 9, wherein the Nth GOA sub circuit further comprises:
a fourth pull-down unit connected to the cascade control unit, the first low voltage level signal, and the drive signal generation unit and configured to control, according to the second drive signal, whether the Nth sub pixel scan signal is in the low voltage level state.

11. The GOA circuit of claim 10, wherein the cascade control unit comprises a first thin film transistor;
a gate of the first thin film transistor is inputted with the (N+3)th cascade signal, a drain of the first thin film transistor is inputted with the (N−3)th scan signal, and a source of the first thin film transistor is configured to output the first drive signal.

12. The GOA circuit of claim 11, wherein the cascade signal generation unit comprises a second thin film transistor;
a drain of the second thin film transistor is inputted with the Nth clock signal, a gate of the second thin film transistor is connected to the source of the first thin film transistor, so that the gate of the second thin film transistor is inputted with the first drive signal;
a source of the second thin film transistor is configured to output the Nth cascade signal.

13. The GOA circuit of claim 12, wherein the first scan drive unit comprises a capacitor, a third thin film transistor, and a fourth transistor;
a drain of the third thin film transistor is inputted with the Nth clock signal, and the source of the first thin film transistor is connected to a gate of the third thin film transistor and a first terminal of the capacitor,
a gate of the fourth transistor is connected to the first low voltage level signal, and a source of the third thin film transistor is connected to a drain of the fourth transistor and a second terminal of the capacitor.

14. The GOA circuit of claim 13, wherein the second scan drive unit comprises a fifth thin film transistor and a sixth transistor;
a drain of the fifth thin film transistor is inputted with the Nth clock signal, a gate of the fifth thin film transistor is connected to the source of the first thin film transistor, and a source of the fifth thin film transistor is connected to a drain of the sixth thin film transistor;
a gate of the sixth thin film transistor is inputted with the (N+3)th cascade signal, and a source of the sixth thin film transistor is inputted with the first low voltage level signal.

15. The GOA circuit of claim 14, wherein the first pull-down unit comprises a seventh thin film transistor;
a gate of the seventh thin film transistor is inputted with the (N+3)th cascade signal, a drain of the seventh thin film transistor is connected to the source of the first thin film transistor, and a source of the seventh thin film transistor is connected to the second low voltage level signal.

16. The GOA circuit of claim 15, wherein the drive signal generation unit comprises an eighth thin film transistor, a ninth thin film transistor, a tenth thin film transistor, and an eleventh thin film transistor;
the high voltage level signal is connected to a gate of the eighth thin film transistor, a drain of the eighth thin film transistor, and a drain of the ninth thin film transistor;
a source of the eighth thin film transistor is connected to a gate of the ninth thin film transistor and a drain of the tenth thin film transistor, a source of the ninth thin film transistor is connected to a drain of the eleventh thin film transistor, the source of the first thin film transistor is connected to a gate of the tenth thin film transistor and a gate of the eleventh thin film transistor, and the second low voltage level signal is connected to a source of the tenth thin film transistor and a source of the eleventh thin film transistor.

17. The GOA circuit of claim 16, wherein the second pull-down unit comprises a twelfth thin film transistor;
a drain of the twelfth thin film transistor is connected to the source of the first thin film transistor, a source of the twelfth thin film transistor is connected to the second low voltage level signal, and a gate of the twelfth thin film transistor is connected to the drain of the eleventh thin film transistor.

18. The GOA circuit of claim 17, wherein the third pull-down unit comprises a thirteenth thin film transistor;
a drain of the thirteenth thin film transistor is connected to the drain of the fourth thin film transistor, a source of the thirteenth thin film transistor is connected to the first low voltage level signal, and a gate of the thirteenth thin film transistor is connected to the drain of the eleventh thin film transistor.

19. A display panel, comprising the GOA circuit of claim 6.

* * * * *